United States Patent
Crippa et al.

(10) Patent No.: US 7,408,819 B2
(45) Date of Patent: Aug. 5, 2008

(54) SEMICONDUCTOR MEMORY DEVICE WITH A PAGE BUFFER HAVING AN IMPROVED LAYOUT ARRANGEMENT

(75) Inventors: Luca Crippa, Busnago (IT); Rino Micheloni, Turatte (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 144 days.

(21) Appl. No.: 11/459,831

(22) Filed: Jul. 25, 2006

(65) Prior Publication Data

US 2007/0025148 A1 Feb. 1, 2007

(51) Int. Cl.
*G11C 7/10* (2006.01)
(52) U.S. Cl. .................. 365/189.15; 365/189.16; 365/189.14; 365/189.05; 365/51; 365/63; 365/185.12; 365/185.17
(58) Field of Classification Search ............ 365/185.12, 365/185.11, 185.17, 189.05, 189.14, 189.15, 365/189.16, 189.17, 51, 63
See application file for complete search history.

(56) References Cited

U.S. PATENT DOCUMENTS

| | | | |
|---|---|---|---|
| 4,418,399 A | 11/1983 | Sakurai | |
| 5,625,590 A | 4/1997 | Choi et al. | |
| 6,377,507 B1 | 4/2002 | Tsao | |
| 6,678,191 B2 * | 1/2004 | Lee et al. ............... | 365/185.33 |
| 6,859,401 B2 * | 2/2005 | Hosono et al. ........ | 365/189.05 |
| 6,967,868 B2 * | 11/2005 | Kim et al. .............. | 365/185.09 |
| 2002/0186591 A1 | 12/2002 | Lee et al. | |
| 2004/0062099 A1 | 4/2004 | Hosono et al. | |
| 2004/0240268 A1 | 12/2004 | Kim et al. | |
| 2007/0025148 A1 * | 2/2007 | Crippa et al. ............ | 365/185.2 |

FOREIGN PATENT DOCUMENTS

DE 103 44 021 A1 7/2004

* cited by examiner

*Primary Examiner*—Andrew Q Tran
(74) *Attorney, Agent, or Firm*—Lisa K. Jorgenson; Robert Iannucci; Seed IP Law Group PLLC (57) ABSTRACT

A memory device is provided. The memory device includes a matrix of memory cells adapted to store data and arranged in a plurality of bit lines, the bit lines extending along a first direction; a page buffer adapted to interface the matrix with a downstream circuitry, the page buffer comprising a plurality of read/program units. Each read/program unit is associated with at least one bit line. The memory device further includes at least two groups each including at least two respective read/program units, wherein the read/program units of a generic one of said groups are generically aligned along the first direction. Each group comprises at least one signal track shared by the at least two read/program units of the group.

18 Claims, 8 Drawing Sheets

SEMICONDUCTOR MEMORY DEVICE WITH A PAGE BUFFER HAVING AN IMPROVED LAYOUT ARRANGEMENT

BACKGROUND OF THE INVENTION

1. Field of the Invention

The present invention generally relates to the field of solid-state memories, particularly to semiconductor memories and, even more particularly, to the field of non-volatile memories. Specifically, the invention relates to non-volatile memories that are electrically programmable.

2. Description of the Related Art

Non-volatile memories are commonly used in several applications when the data stored in the memory device need to be preserved even in absence of power supply. Within the class of non-volatile memories, electrically programmable (and erasable) memories, such as flash memories, have become very popular in applications in which the data to be stored are not immutable (as it might be case of, e.g., a consolidated code for a microprocessor), being instead necessary from time to time to store new data, or to update the data already stored.

Typically, the memory device includes an arrangement of memory cells, disposed for example in rows and columns, so as to form a matrix.

Depending on the way the memory cells in the matrix are interconnected, two classes of flash memories can be identified: those having a so-called NOR architecture, or NOR flash memories, and those having a so-called NAND architecture, shortly referred to as NAND flash memories. Roughly speaking, in a NOR architecture the memory cells of a same matrix column are connected in parallel to a same bit line, whereas in a NAND architecture groups of memory cells of a same matrix column are serially interconnected so as to form respective strings, which strings are then connected in parallel to each other to a same bit line.

Compared to NOR flash memories, NAND flash memories are more compact (a lower number of contacts in the matrix are required), and they are also better suited for applications such as file storage.

In the NAND architecture, the memory space is ideally partitioned into a plurality of memory pages, each page corresponding to a block of memory cells that, in operation, are read or written simultaneously, i.e., in parallel to each other. The number of memory cells in each block determines the size (i.e., the number of bits) of the memory page. Nowadays, memory pages of 8192 cells are rather typical, but larger memory pages are also encountered, for example of 16384 cells.

Clearly, the memory cannot have so high a number of Input/Output (I/O) terminals as to enable transferring in parallel so long data words; usually, eight or sixteen I/O terminals are in fact provided; thus, some kind of "segmentation" of the memory page is necessary for interfacing the memory with the outside world.

To this purpose, a circuit arrangement called "page buffer" is provided in the memory for managing the operations of reading the information stored in the memory cells of a selected memory page, or writing new information thereinto. In very general terms, the page buffer includes a buffer register of size equal to that of the memory page, wherein data read (in parallel) from the memory cells of a selected page are temporarily stored, before being serially outputted in chunks of, e.g., eight or sixteen bits, depending on the number of I/O terminals of the memory; similarly, when data are to be written into the memory, the page buffer is replenished with data received serially in said eight- or sixteen-bits chunks, and, when the buffer has eventually been filled, the data are written in parallel into the memory cells of a given, selected memory page.

The page buffer includes a relatively high number of volatile storage elements, typically bi stable elements or latches, in a number corresponding to the number of memory cells of the memory page.

The basic operations that usually are performed on the memory cells are a "page read" (an operation involving reading data from a selected memory page), a "page program" (writing data into a selected memory page), and an "erase" operation, wherein the storing of the memory cells is erased.

The page buffer typically includes a plurality of read/program units, each one associated with, and operatively couplable to a respective plurality of bit lines, e.g., a pair of bit lines.

From a layout point of view, because of space constraints, it is practically impossible to position the different read/program units directly in correspondence of the corresponding pair of bit lines. In fact, the pitch of a pair of bit lines is much lower than the pitch of the corresponding single read/program unit (which typically includes several transistors).

For this reason, groups of more than one read/program unit, for example four read/program units, may be positioned in a sort of stack along the direction of the bit lines, in the pitch of a corresponding number of, e.g. four pairs of bit lines.

This solution may pose problems in terms of routing of the conductive tracks necessary to bring signals into/out of the read/program units.

BRIEF SUMMARY OF THE INVENTION

In view of the state of the art outlined, the Applicant has tackled the problem of devising a layout arrangement for the page buffer of a memory device that is not affected by the problems discussed above.

According to an embodiment of the present invention, a memory device includes a matrix of memory cells adapted to store data and arranged in a plurality of bit lines extending along a first direction and a page buffer adapted to interface the matrix with a downstream circuitry. The page buffer comprises a plurality of read/program units, each one being associated with and operatively couplable to at least one bit line. The memory device further includes at least two groups each including at least two respective read/program units. The read/program units of a generic one of said groups are generically aligned along the first direction. The at least two groups are generically aligned along a second direction transverse to the first direction. The memory device further includes at least one signal track associated with each one of said groups for conveying signals corresponding to data read from the memory cells to the downstream circuitry. Said at least one signal track is shared by the at least two read/program units of the corresponding group. The memory device further including means for selectively assigning the at least one signal track to one of the associated read/program unit at a time among the at least two read/program units of the group associated with said signal track.

One embodiment of the invention is a page buffer for a memory device comprising a plurality of read/program units arranged in columns of units, each column forming a group of units, each unit being coupled to one or more bit lines of an array of memory cells and having a signal line configured to apply a voltage to a bit line. The units in a group are connected to a same signal track configured to output data to circuitry downstream and the signal lines of the units in a group have an approximately same length.

One embodiment of the invention is a method for implementing a page buffer in a memory device, the page buffer having a plurality of read/program units, the memory device having memory cells connected to array bit lines. The method comprises organizing the units into a plurality of columns, each column forming a group of units, each unit being coupled to one or more bit lines and having a signal line configured to apply a voltage to a bit line coupled to the unit. The method further comprises coupling each unit in a group to a same signal track configured to output data to circuitry downstream and forming the signal line of each unit in a group to be approximately the same length.

The invention itself, as well as further features and advantages thereof will be best understood by reference to the following detailed description, given purely by way of a non-restrictive indication, to be read in conjunction with the accompanying drawings.

DETAILED DESCRIPTION OF THE INVENTION

Figure 1:
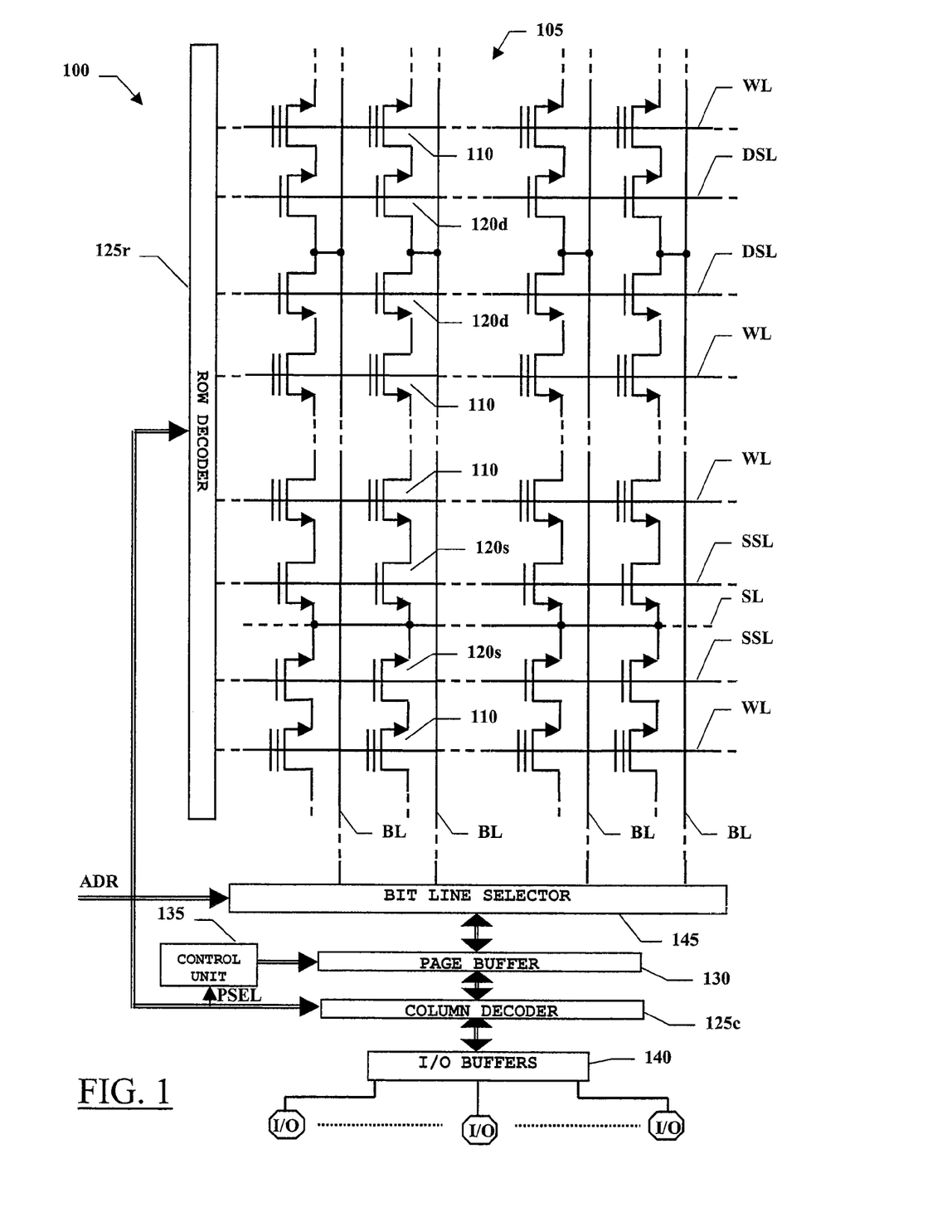
FIG. 1 is a circuital view of a non-volatile memory device, particularly of the NAND type.

With reference to the drawings, in FIG. 1 a non-volatile semiconductor memory, globally identified as 100, is illustrated, particularly an electrically-programmable, non-volatile semiconductor memory, for example a flash memory.

The flash memory 100 is integrated in a chip of semiconductor material, and includes a matrix 105 of memory cells 110, arranged in a plurality of rows and a plurality of columns.

Typically, each memory cell 110 consists of an N-channel MOS transistor having a charge-storage element, such as a conductive floating gate adapted to be charged by electrons.

The flash memory 100 is a multi-level memory, particularly (for the sake of simplicity) a four-level memory, each cell being adapted to store a two-bit binary value, comprised of a Least Significant Bit (LSB) and a Most Significant Bit (MSB). Without entering into excessive details, well known to those skilled in the art, in an erased condition (first state, associated by convention with a logic value "11"), the memory cell 110 has a low threshold voltage value. The memory cell 110 may be programmed into any one of three further different states by causing amounts of electric charge to be put into the floating gate thereof. Each of these further three states is characterized by an increased threshold voltage value (given by an increased amount of floating-gate electric charge) compared to that of the preceding state. More particularly, a second state (associated with a logic value "10"), is characterized by a threshold voltage value that is higher than that of the first state, and that is in turn lower than that of a third state (associated with a logic value "00"). Finally, a fourth state (associated with a logic value "01"), is characterized by having the highest threshold voltage value. As will be made clearer in the following, when a selected memory cell 110 is selected for reading its content, the memory cell 110 will be conductive or not depending on its threshold voltage value.

The flash memory 100 has a so-called NAND architecture: in the matrix 105, groups of, e.g., eight, sixteen or even more (e.g., thirty-two) memory cells 110 are connected in series to each other to form a respective memory cells string, and different memory cells strings belonging to a same matrix column are connected in parallel to each other to a same bit line BL.

The memory cells 110 of a generic string are in particular connected in series between a source select N-channel MOS transistor 120s and a drain select N-channel MOS transistor 120d. A generic, intermediate memory cell 110 in the memory cells string has the drain terminal connected to the source terminal of an adjacent memory cell 110, and the source terminal connected to the drain terminal of another adjacent memory cell 110. One of the two end memory cells 110 located at the ends of the string has the drain terminal connected to the source terminal of the drain select transistor 120d; the drain terminal of the drain select transistor 120d is connected to the corresponding bit line BL, as well as to the drain terminal of the corresponding drain select transistor 120d of an adjacent memory cells string. Likewise, the other end memory cell 110 of the string has the source terminal connected to the drain terminal of the source select transistor 120s; the source terminal of the source select transistor 120s is connected to the source terminal of the corresponding source select transistor 120s of another adjacent memory cells string.

The control gate terminals of the memory cells 110 in each row are connected to a corresponding word line WL. The gate terminals of the drain select transistors 120d belonging to a common row of the matrix 105 are all connected to a corresponding drain select line DSL; similarly, the gate terminals of the source select transistors 120s belonging to a common row are all connected to a corresponding source select line SSL. The drain terminals of the drain select transistors 120d belonging to a common column of the matrix 105 are connected to a corresponding bit line BL. Conversely, the source terminals of all the source select transistors 120s in the matrix 105 are connected to a common source line SL (which is typically kept at a reference voltage, or ground).

The memory cells 110 belonging to the same row are logically partitioned into different sets. Assuming, merely by way of example, that the matrix 105 includes 8192 bit lines BL, two sets of 4096 memory cells each for each word line WL are defined, a first set consisting for example of the memory cells 110 in an even position, and a second set consists of the memory cells 110 in an odd position.

As previously stated, the two bits stored in each memory cell 110 comprise an LSB and an MSB. Moreover, there subsists a correspondence between the logic values assumed by the LSB and MSB, and the threshold voltage values of the memory cells 110. For reducing the number of read accesses necessary to retrieve the stored data, said correspondence between logic values and threshold voltages makes use of the Gray coding.

Figure 2A:
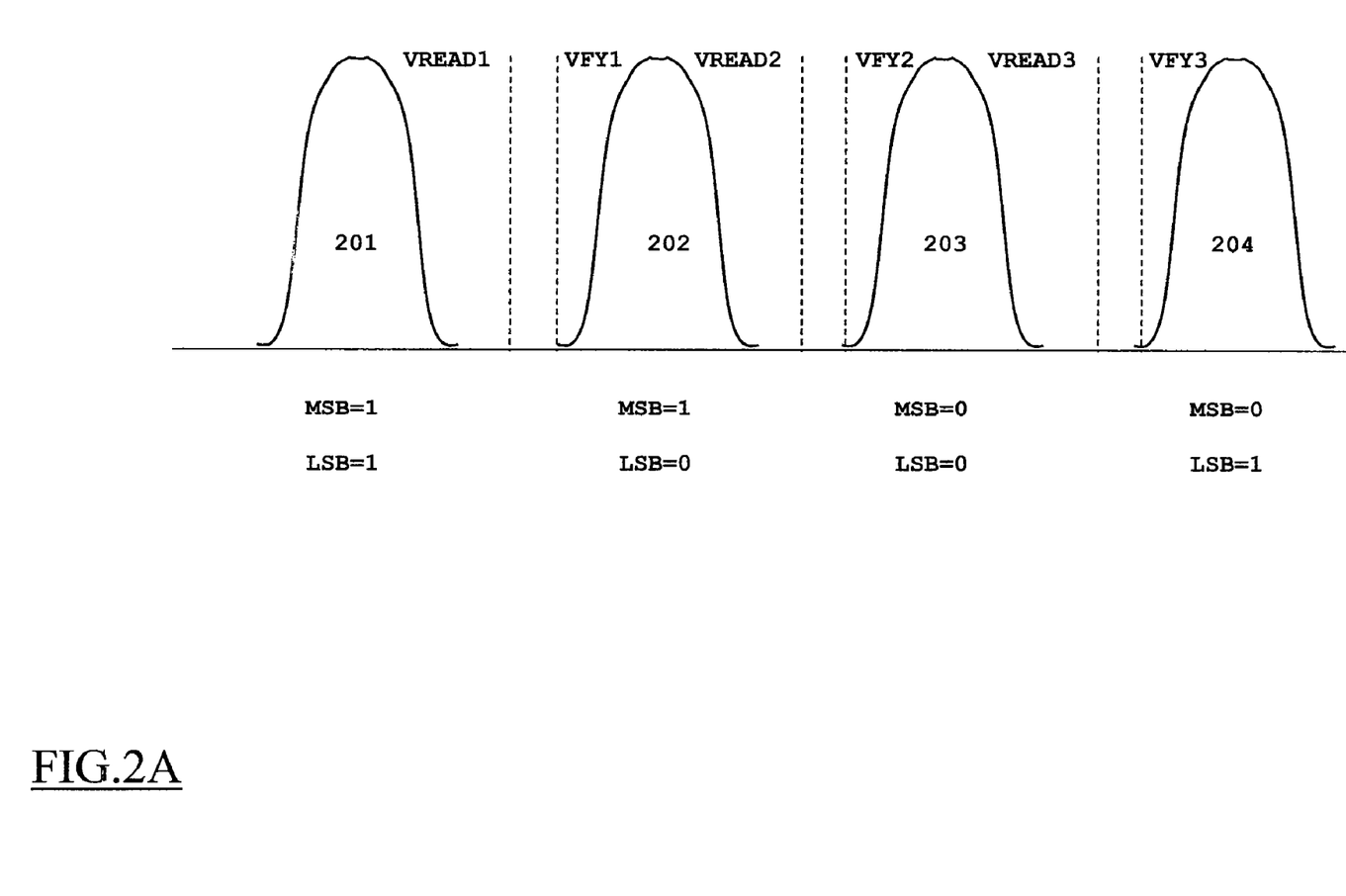
FIG. 2A is a simplified view of threshold voltage statistical distributions of the memory cells of the memory device of FIG. 1.

More particularly, referring to FIG. 2A, a simplified view of threshold voltages statistical distributions 201, 202, 203, 204 of the memory cells 110 is illustrated. More particularly, the distribution 201 represents the distribution of the threshold voltage values of the memory cells in the erased condition, i.e., of the cells belonging to the first state, associated with the logic value "11" (MSB=1, LSB=1). The distribution 202 represent the distribution of the threshold voltage values of the memory cells in the second state, associated with the logic value "10" (MSB=1, LSB=0); the distribution 203 represent the distribution of the threshold voltage values of the memory cells in the third state, associated with the logic value "00" (MSB=0, LSB=0); and the distribution 204 represent the distribution of the threshold voltage values of the memory cells in the fourth state, associated with the logic value "01" (MSB=0, LSB=1). The distributions are for example roughly Gaussian in shape, and are each one centered around a center threshold voltage value. Thanks to the Gray coding, states that are adjacent (in terms of their distribution of threshold voltage values) have corresponding logic values that differ from each other for only one bit.

Each word line WL corresponds, according to the present example, to four memory pages, each one corresponding to a specific group of bits. More particularly, a first LSB page includes the LSB stored in the memory cells in even positions (belonging to the first set of memory cells), while a first MSB page includes the MSB stored in the memory cells in even positions. Furthermore, a second LSB page includes the LSB stored in the memory cells in odd positions (belonging to the second set of memory cells), while a second MSB page includes the MSB stored in the memory cells in odd positions. Consequently, the data stored into a single memory cell belongs both to an LSB page and to an MSB page.

Given that each memory cell 110 is capable to store 2 bits, each set of 4096 memory cells stores 1024 bytes. Consequently, each memory page is capable to store 512 bytes. Thus, if, still by way of example, the matrix 105 includes 2048 word lines WL, the memory 100 has a total of 8192 memory pages of 512 bytes each. It is pointed out that the number of bit lines and word lines as well as the size of the memory page, may greatly vary, not being a limitation for the present invention. In particular, the number of memory pages that are associated with a generic word line may be higher, particularly multiples of two, such as eight and so on.

The flash memory 100 receives an address code ADR for selecting a desired memory page. A portion of the address code ADR is supplied to a row decoder 125r, which selects the desired word line WL, as well as the corresponding drain select line DSL and the corresponding source select line SSL. Another portion of the address code ADR is supplied to a column decoder 125c; the column decoder 125c connects I/O buffers 140, which are in turn associated with I/O terminals I/O of the flash memory 100, to a page buffer 130. A further portion of the address code ADR, denoted PSEL in FIG. 1, for example one bit, is used for selecting which one of the (two, in the example) memory pages (the memory page including the MSBs or the memory page including the LSBs of the memory cells of a given set) is addressed.

The page buffer 130 is exploited as a temporary storage during read/program operations on the memory cells 110 of the selected page. The page buffer 130 has a storage capability at least equal to the storage capability of a memory page. For fitting an internal data parallelism of the flash memory 100 with a maximum external data parallelism, depending on a number p of the I/O terminals I/O (for example, eight or sixteen), the column decoder 125c provides to the page buffer 130 a data word to be written, or provides to the I/O terminals I/O a data word read, in chunks of p data bits at a time. Particularly, according to the decoding of the received portion of the address code ADR, the column decoder 125c connects desired portions of the page buffer 130 to the I/O terminals I/O.

The operation of the flash memory 100 is generally managed by a control unit, schematized as a block identified as 135, for example a microcontroller or a finite-state machine.

Figure 2B:
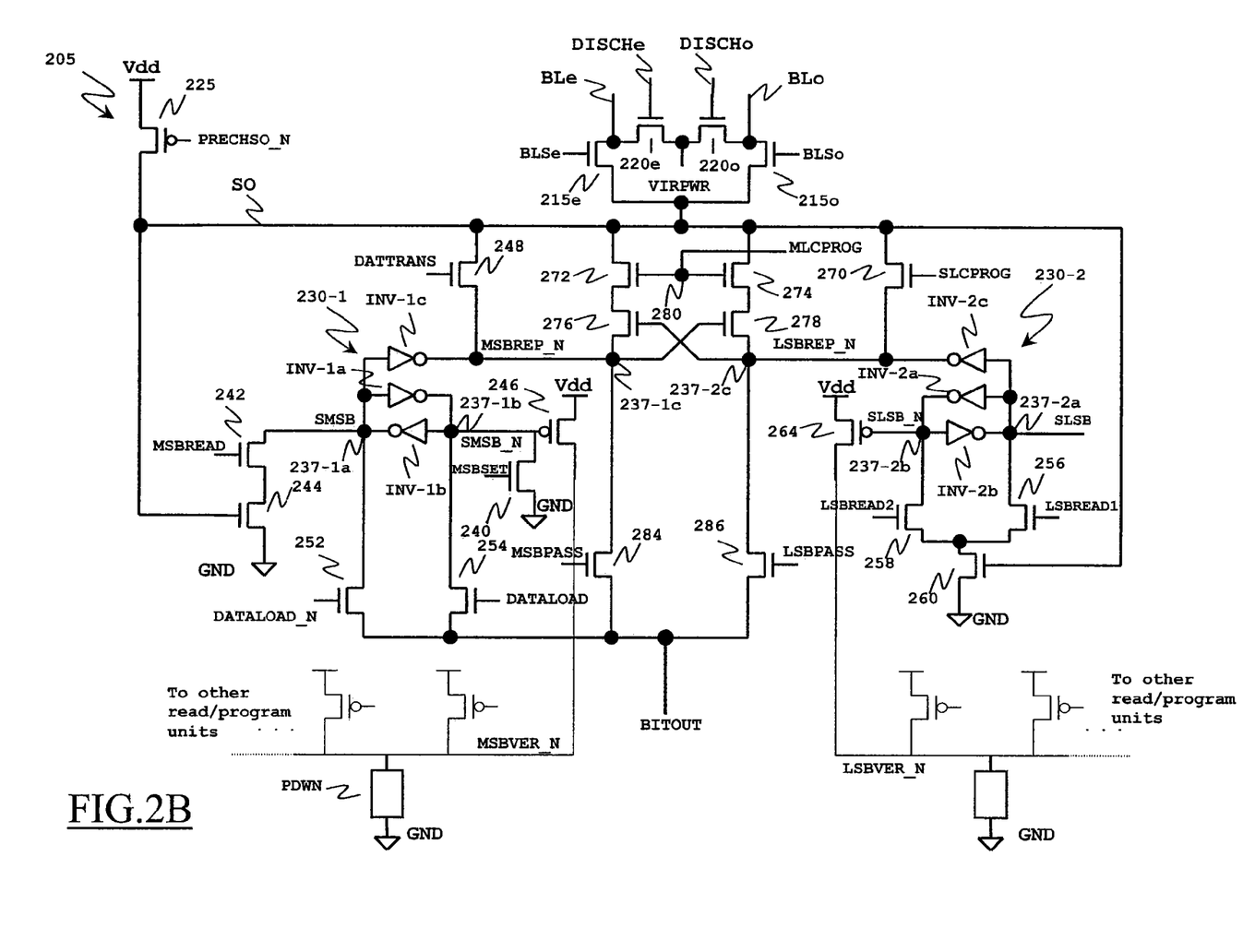
FIG. 2B illustrates the circuital view of a read/program unit included in the page buffer of the memory device, according to an embodiment of the present invention.

In FIG. 2B the circuit structure of the page buffer 130 is shown, according to an embodiment of the present invention.

It has to be clarified, that unless differently specified, the signals described in connection with the FIG. 2B are to be intended as logic signals, i.e., adapted to assume two voltage values, that is the supply voltage Vdd, and the ground voltage.

In the exemplary invention embodiment herein described, it is assumed that the page buffer 130 is adapted to implement operations more complex than a simple page read, a simple page program, and a simple erase operation; in particular, it is assumed that the page buffer 130 is adapted to implement operations such as a cache read operation, and a cache program operation, as will be described in detail later.

The page buffer includes a read/program unit 205 for each pair of adjacent bit lines (also each pair of the redundant bit lines is associated with a corresponding read/program unit 205). Particularly, an even bit line BLe and an odd bit line BLo are electrically couplable to a common node SO through respective N-channel MOS transistors 215e and 215o, included in the bit line selector 145. The transistors 215e and 215o have the respective drain terminal connected to the corresponding bit lines BLe, BLo, and the source terminals connected to the node SO; the gate terminals of the transistors 215e and 215o are controlled by respective select signals BLSe and BLSo, respectively. Two N-channel MOS transistors 220e and 220o are also provided in the bit line selector 145, each one for precharging/discharging the respective bit line BLe and BLo to a biasing voltage VIRPWR (such a precharge/discharge operation is preferably performed before any program operation, as described in the following). To this purpose, the transistors 220e and 220o have the source terminals connected to the corresponding bit lines BLe, BLo; the drain terminals of the transistors 220e and 220o are connected together to a terminal for providing the biasing voltage VIRPWR. The gate terminals of the transistors 220e, 220o are controlled by respective precharge/discharge signals DISCHe, DISCHo.

A P-channel MOS transistor 225 is used for precharging the node SO during certain phases of the page buffer functioning, e.g., at the beginning of a read/program operation. For this purpose, the transistor 225 has the drain terminal connected to the node SO, the source terminal connected to a terminal providing the supply voltage Vdd, and the gate terminal controlled by a pre-charge signal PRECHSO_N.

The read/program unit 205 includes a first latch 230-1 and a second latch 230-2. The latch 230-1 is adapted to be employed for the reading of the MSB, for the programming of the MSB, for the loading of data from the outside of the page buffer during a writing operation, for the cache read and for the cache program operations. The latch 230-2 is instead adapted to be employed for the reading of the LSB, for the programming of the LSB and the MSB, for the cache read and for the erase operations.

The latch 230-1 is formed by two inverters INV-1a and INV-1b, connected in a loop with the input terminal of the inverter INV-1a connected to the output terminal of the inverter INV-1b so as to define a node 237-1a, providing a signal SMSB, and the output terminal of the inverter INV-1a connected to the input terminal of the inverter INV-1b so as to define a node 237-1b, providing a signal SMSB_N that is the logic complement of the signal SMSB. Moreover, a further inverter INV-1c has an input terminal connected to the node 237-1a, and an output terminal that is connected to a node 237-1c, providing it the signal MSBREP_N, having the same polarity of the signal SMSB_N.

An N-channel MOS transistor 240 is used to set the latch 230-1; by "set the latch" there is meant bringing the signal SMSB to the supply voltage VDD. For this purpose, the transistor 240 has the drain terminal connected to the node 237-1b, the source terminal connected to ground and the gate terminal controlled by an MSB latch reset signal MSBSET. The latch 230-1 is reset (i.e., the signal SMSB is brought to the ground voltage) by means of two N-channel MOS transistors 242 and 244 that are connected in series: the transistor 242 has the drain terminal connected to the node 237-1a and the source terminal connected to the drain terminal of the transistor 244; the source terminal of the transistor 244 is connected to ground. The gate terminal of the transistor 244 is controlled by the voltage at the node SO, whereas the gate terminal of the transistor 242 is controlled by a MSB latching or read signal MSBREAD.

A P-channel MOS transistor 246 is used during a program verify phase for establishing if a MSB program operation has been accomplished in the correct way. For this purpose, the transistor 246 has the source terminal connected to a terminal providing the supply voltage Vdd, a gate terminal connected to the node 237-1b, and the drain terminal connected (node MSBVER_N) to a first terminal of a highly-resistive pull down circuit PDWN, the latter having a second terminal connected to ground. Said pull down circuit PDWN is placed outside the single read/program unit 205, and its first terminal is commonly connected to transistors 246 in all the other read/write units included in the page buffer 130, in the same way as for the read/write unit herein described.

An N-channel MOS transistor 248 is used to couple the node 237-1c to the node SO, in order to allow the data transfer from the latch 230-1 to the latch 230-2. For this purpose, the transistor 248 has the drain terminal connected to the node SO and the source terminal connected to the node 237-1c; the gate terminal of the transistor 248 is controlled by a data transfer signal DATTRANS.

N-channel MOS transistors 252 and 254 are used to load data to be written into the first latch 230-1 at the beginning of a program operation. For this purpose, the transistors 252 and 254 have respective drain terminals connected to the nodes 237-1a and 237-1b. The source terminals of the transistors 252 and 254 are connected together to an I/O data line BITOUT in turn connected to the column decoder 125c, thus establishing a connection between the read/program unit 205 and the I/O buffers 140. Consequently, the I/O data line BITOUT is adapted to provide data to be programmed into the memory cells to the read/program unit, and to provide data that have been read by the read/program unit 205 to the I/O buffers 140. The gate terminal of the transistor 252 receives a data load signal DATALOAD_N (whose logic state determines the target value to be loaded into the first latch 230-1) and the gate terminal of the transistor 254 receives a further data load signal DATALOAD (which is the logic complement of the data load signal DATALOAD_N).

The latch 230-2 is formed by two inverters INV-2a and INV-2b, connected in a loop with the input terminal of the inverter INV-2a connected to the output terminal of the inverter INV-2b so as to define a node 237-2a, providing a signal SLSB, and the output terminal of the inverter INV-2a connected to the input terminal of the inverter INV-2b so as to define a node 237-2b, providing a signal SLSB_N that is the logic complement of the signal SLSB. Moreover, a further inverter INV-2c has an input terminal connected to the node 237-2a, and an output terminal that is connected to a node 237-2c, providing it the signal LSBREP_N, having the same polarity of the signal SLSB_N.

Three N-channel MOS transistors 256, 258 and 260 are used to set/reset the latch 230-2 and to read/verify the LSB. For this purposes, the transistor 256 has the drain terminal connected to the node 237-2a, the source terminal connected to the drain terminal of the transistor 260, and the gate terminal controlled by a first LSB latching or read signal LSBREAD1. The transistor 258 has the drain terminal connected to the node 237-2b, the source terminal connected to the drain terminal of the transistor 260, and the gate terminal controlled by a second LSB latching or read signal LSBREAD2. Moreover, the transistor 260 has the source terminal connected to a terminal providing the ground voltage, and the gate terminal connected to the node SO.

A P-channel MOS transistor 264 is used during verify phases for establishing if an erase operation, or an LSB or an MSB program operation has been accomplished in the correct way. For this purpose, the transistor 264 has the source terminal connected to a terminal providing the supply voltage Vdd, a gate terminal connected to the node 237-2b, and the drain terminal connected (node LSBVER_N) to a first terminal of a further highly-resistive pull down circuit (not shown in the Figure for the sake of simplicity), having the same features of the highly-resistive pull down circuit PDWN, and connected to all the read/write units included in the page buffer 130.

A further N-channel MOS transistor 270 is used to couple the node 237-2c to the node SO, thus to the selected bit line BLe or BLo, during a program operation (as described in greater detail in the following). For this purpose, the transistor 270 has the drain terminal connected to the node SO and the source terminal connected to the node 237-2c; the gate terminal of the transistor 270 is controlled by a program signal SLCPROG.

The read/program unit 205 further includes a four transistor structure that is used for programming the MSB. More particularly, said structure includes four N-channel MOS transistors 272, 274, 276 and 278. The transistor 272 has the drain terminal connected to the node SO, the source terminal connected to the drain terminal of the transistor 276, and the gate terminal connected to the gate terminal of the transistor 274 (node 280). The transistor 274 has the drain terminal connected to the node SO, the source terminal connected to the drain terminal of the transistor 278, and the gate terminal that is connected to the node 280. The transistor 276 has the source terminal connected to the node 237-1c, and the gate terminal connected to the node 237-2c. The transistor 278 has the source terminal connected to the node 237-2c, and the gate terminal connected to the node 237-1c. Moreover, the node 280 receives a further program signal MLCPROG.

Two N-channel MOS transistors 284, 286 are used for providing data to the output of the page buffer 130. More particularly, the transistor 284 has the drain terminal connected to the node 237-1c, the source terminal connected to the I/O data line BITOUT, and the gate terminal controlled by a MSB output signal MSBPASS. The transistor 286 has the drain terminal connected to the node 237-2c, the source terminal connected to the I/O data line BITOUT, and the gate terminal controlled by a LSB output signal LSBPASS.

A memory page is selected by selecting a given word line WL, and a packet of bit lines BL; for example, if four memory pages of 512 Bytes each exist for each word line, one page corresponding to the LSB of the memory cells in even position, one corresponding to the MSB of the memory cells in even position, one corresponding to the LSB of the memory cells in odd position, and one corresponding to the MSB of the memory cells in odd position, the packet of selected bit lines BL includes the 4096 bit lines in even position or the 4096 bit lines in odd position (it has to be remembered that the data stored into a single memory cell belongs both to an LSB page and to an MSB page). During a read operation (page read), a data word stored in the selected memory page is read out and latched into the page buffer 130. The data word, temporarily stored in the page buffer 130, is then serially outputted through the I/O terminals I/O in chunks of, e.g., eight or sixteen bits by means of the column decoder 125c.

In greater detail, in order to access a given memory cell 110 for reading the content thereof, the drain select transistor 120d and the source select transistor 120s in the memory cells string to which the cell belongs are turned on, by asserting the drain select line DSL and the source select line SSL (for example, these two lines are brought to a voltage equal to the supply voltage Vdd of the memory); the bit line BL to which there is connected the string of cells containing the memory cell to be read is selected by the bit line selector 145. The row decoder 125r biases the word line WL to which the selected memory cell belongs to a specific reading voltage VREADX (X=1, 2, 3, as is explained in the following) adapted to discriminate the programming state of the memory cell; the remaining word lines WL controlling the gates of the other memory cells of the same string are all brought to a potential sufficiently high to ensure that these memory cells are turned on irrespective of their programming state (for example, a voltage of approximately 4.5 V). All the other word lines WL (associated with different memory cells strings) are for example kept grounded.

For reading the MSB of a memory cell 110, the row decoder 125r biases the word line WL to which the selected memory cell belongs to a reading voltage VREAD2, having a value that is intermediate between the center threshold voltages of the distribution 202 and the voltages of the distribution 203. If the threshold voltage of the selected memory cell 110 is lower than the reading voltage VREAD2, the selected memory cell 110 conducts, thus indicating that the MSB is equal to 1 (it has to be noted that it does not matter if the selected cell belongs to the distribution 201 or to the distribution 202, because both of which correspond to data values in which the MSB is equal to one). Contrarily, if the threshold voltage of the selected memory cell 110 is higher than the reading voltage VREAD2, the selected memory cell 110 does not conduct, thus indicating that the MSB in the stored pair of bit is equal to 0. Thus, it can be appreciated that only one reading operation is necessary to retrieve the value of the MSB.

For reading the LSB two reading operations are necessary. More specifically, a first reading operation is performed by biasing, by means of the row decoder 125r, the word line WL to which the selected memory cell belongs to a reading voltage VREAD1, having a value that is intermediate between the center threshold voltages of the distributions 201 and 202. If the threshold voltage of the selected memory cell 110 is lower than the reading voltage VREAD1, the selected memory cell 110 conducts, thus indicating that it belongs to the distribution 201 (first programming state), and that the LSB is equal to 1. In this case, just one read access is necessary for retrieving the stored LSB. Contrarily, if the threshold voltage of the selected memory cell 110 is higher than the reading voltage VREAD1, the selected memory cell 110 does not conduct, thus indicating that it does not belong to the distribution 201. In the latter case, a second reading operation needs to be performed, biasing the word line WL to which the selected memory cell belongs to a reading voltage VREAD3, having a value that is intermediate between the center threshold voltages of the distributions 203 and 204. If the threshold voltage of the selected memory cell 110 is lower than the reading voltage VREAD3, the selected memory cell 110 conducts, thus indicating that the LSB is equal to 0 (given that the first reading operation has indicated that the threshold voltage is higher than VREAD1). Conversely, if the threshold voltage of the selected memory cell 110 is higher than the reading voltage VREAD3, the selected memory cell 110 does not conduct, thus indicating that it belongs to the distribution 204, and that the LSB is equal to 1.

The page buffer 130 is operated to execute an MSB read operation rather than an LSB read operation (or vice versa) depending on whether an MSB memory page rather then an LSB memory page has been addressed. This is controlled by the control unit 135 that decodes and recognizes the value of the address portion PSEL. In fact, the control unit 135 generates the signals adapted to drive the execution of all the procedures necessary for performing an LSB read operation (e.g., applying the reading voltages VREAD1 and VREAD3) or for performing an MSB read operation (e.g., applying the reading voltage VREAD2), depending on the value of the address portion PSEL.

During a program operation (page program), a data word to be written, received from outside the memory through the I/O terminals I/O, is loaded into the page buffer 130. The data word to be written is received serially in, e.g., eight- or sixteen-bit chunks, and the page buffer 130 is thus replenished with data in a sequence of steps; when the buffer has eventually been filled, the data are written in parallel into the memory cells of a given selected page.

Memory cells 110 are programmed by Fowler-Nordheim tunneling of electrons into the floating gate. In order to access a given memory cell 110 for programming it, the drain select transistor 120d in the memory cells string to which the cell belongs is turned on by asserting the drain select line DSL (for example, bringing this line to the supply voltage Vdd), whereas the source select transistor 120s is kept off by keeping the source select line SSL deasserted (e.g., grounded); the bit line BL to which there is connected the string of cells containing the memory cell to be programmed is selected by the bit line selector 145. The row decoder 125r biases the word line WL to which the selected memory cell belongs to a programming voltage VPROG, whose value and evolution in time is a function of the programming state that the memory cell 110 has to assume at the end of the program operation. As previously disclosed, the fact that a memory cell 110 is in a particular state is determined by its threshold voltage value, that is in turn determined by the amount of charge present in the corresponding floating gate. Moreover, said amount of charge is in some way proportional to the value and to the rate of increase of the programming voltage VPROG that is applied to the memory cell 110 (e.g., the higher the target threshold voltage value, the higher is the value of the programming voltage VPROG to be applied). The remaining word lines WL controlling the gates of the other memory cells of the same string are all brought to a potential relatively high (e.g., approximately 10 V), for reasons that will be described later, but sufficiently lower than the programming voltage not to cause spurious programming. All the other word lines WL (associated with different memory cells strings) are for example kept grounded. In order to program the selected memory cell, the bit line BL is kept grounded, so that the drain select transistor $120d$ is surely kept on; the ground voltage at the bit line, propagating through the drain select transistor and the channel of the memory cells in the string, reaches the channel of the memory cell to be programmed; here, the voltage difference between the control gate (at the programming voltage VPROG) and the channel (close to the ground voltage) experienced by the selected memory cell is sufficient to cause electron tunneling into the floating gate. On the contrary, if the bit line is biased at a higher potential, for example equal to the memory supply voltage (Vdd, e.g., 3 V), as the drain select line DSL, the drain select transistor $120d$ turns off. Meanwhile, the voltage of the memory cells string rises. The channels of the memory cells of the selected memory cells string thus remain floating, and, thanks to the relatively high voltage (10 V) applied to the word lines WL to which the selected memory cell does not belong, the string channel voltage rises due to the capacitive coupling to a value such that the control gate-to-channel voltage difference at the selected memory cell is not sufficient to cause significant electron tunneling, and the memory cell is not programmed. In this way, by applying to the selected bit lines the proper voltage, the cells 110 of the selected page to be brought to the desired logic value are then programmed, while the other cells 110 are left unchanged. In the same way as in the case of the read operation, for performing a program operation on both the LSB and the MSB, more steps are required. More specifically, assuming that each program operation is performed on erased memory cells 110 (i.e., in the first state), an LSB program operation is firstly performed: if the selected memory cell 110 has to be programmed in such a way to have an LSB value that is equal to 0, the programming voltage VPROG that is applied to the selected word line WL is such as to bring the threshold voltage of the selected memory cell to the distribution 202 (i.e., to the second state). Otherwise, the threshold voltage of the selected memory cell 110 remains in the first distribution (first state, or erased state). Having executed the LSB program operation, the whole program operation is completed by means of the programming of the MSB value. More specifically, if the selected memory cell 110 has to be programmed in such a way to have an MSB value that is equal to 1, no further application of programming voltage VPROGR is needed. Consequently, the threshold voltage of the memory cell remains at the value it reached in the previous step (i.e., belonging to the distribution 201 if LSB is 1, and belonging to the distribution 202 if LSB is 0). On the contrary, if the selected memory cell 110 has to be programmed in such a way to have an MSB value that is equal to 0, the programming voltage VPROG is such as to bring the threshold voltage of the selected memory cell to the distribution 204 (i.e., to the fourth state) if the LSB is equal to 1 (i.e., if the threshold voltage before the MSB programming belonged to the distribution 201); conversely, if the LSB is equal to 0 (i.e., if the threshold voltage before the MSB programming belonged to the distribution 202), the programming voltage VPROG is such as to bring the threshold voltage of the selected memory cell to the distribution 203 (i.e., to the third state).

It has to be noted that, in a practical implementation, the previously described program operations are more complex. In fact, a possible program operation includes the repetition of a plurality of steps, at each step increasing the programming voltage VPROGR (up to a maximum value, e.g., 20V), and, after the application of the programming voltage, the execution of a verify phase for determining if the desired threshold voltage value has been reached. These features will be explained in great detail referring to the following description of the page buffer embodiment herein disclosed.

The erase operation has the purpose of bringing a block of memory cells 110 back to the erased state (logic value "11"), wherein by memory cells block there is intended a group of memory cells 110 corresponding to all the word lines WL of a string.

In order to erase a given block of memory cells 110, the semiconductor well including all the cells of the matrix 105 is biased to a relatively high erase voltage VERASE (e.g., 20 Volts) by means of an erase control circuit, not shown in the Figures, and all the bit lines BL of the matrix 105 are kept floating. Moreover, the row decoder $125r$ biases the word lines WL corresponding to the block to the ground voltage, while the remaining word lines WL of the matrix 105 are kept floating. The drain select lines DSL and the source select lines SSL of the block are kept floating (but they are precharged at about the supply voltage Vdd before the well is biased to the erase voltage VERASE), while the remaining are grounded. In this way, each memory cell 110 included in the selected block is biased in such a way to trigger the removal (by means of tunneling effect) of the electrical charge possibly stored in its floating gate. As previously noted referring to the case of the program operation, even the erase operation is in the practice more complex, including erase verify phases and soft program operations. Again, these additional features will be explained in great detail referring to the following description of the page buffer embodiment disclosed herein.

As previously stated, the coupling between each pair of bit lines and a corresponding read/program unit 205 is accomplished by means of a connection with the circuital node SO included in the latter. The node SO has a variety of functions, regarding the operations performed by the read/program unit 205 on a selected memory cell 110 connected to a bit line coupled thereto. In fact, the node SO is adapted to be charged to the supply voltage Vdd, and to be discharged toward the ground voltage if certain conditions occur.

For example, during both an LSB read operation and an MSB read operation, the node SO is firstly precharged to the supply voltage Vdd, and then it is forced to assume a voltage value equal to that of the coupled bit line. In this way, the node SO discharges or not depending on the conductivity (i.e., the programming state) of the selected memory cell connected to the bit line. Consequently, the node SO remains floating at the supply voltage Vdd if the selected memory cell is not conductive.

Furthermore, during a (LSB or MSB) program operation, the node SO is firstly precharged to the supply voltage Vdd. Then, the node SO is forced to discharge if the selected memory cell 110 has to be programmed. Conversely, the node SO is maintained to the supply voltage Vdd if the selected memory cell 110 has not to be programmed.

Moreover, the operations of precharging/discharging the circuital node SO are also performed whenever a transfer of data from the latch 230-1 to the latch 230-2 is requested.

From the previous description, it can be appreciated that during many operations performed by the page buffer 130, the circuit node SO of each read/program unit 205 is precharged to the supply voltage Vdd. Said voltage value is maintained by the node SO in a floating condition, thanks to the unavoidable parasitic capacitances associated with conductive signal line (e.g., formed from a metallic layer) that physically realizes the node SO in the chip.

Figure 3A:
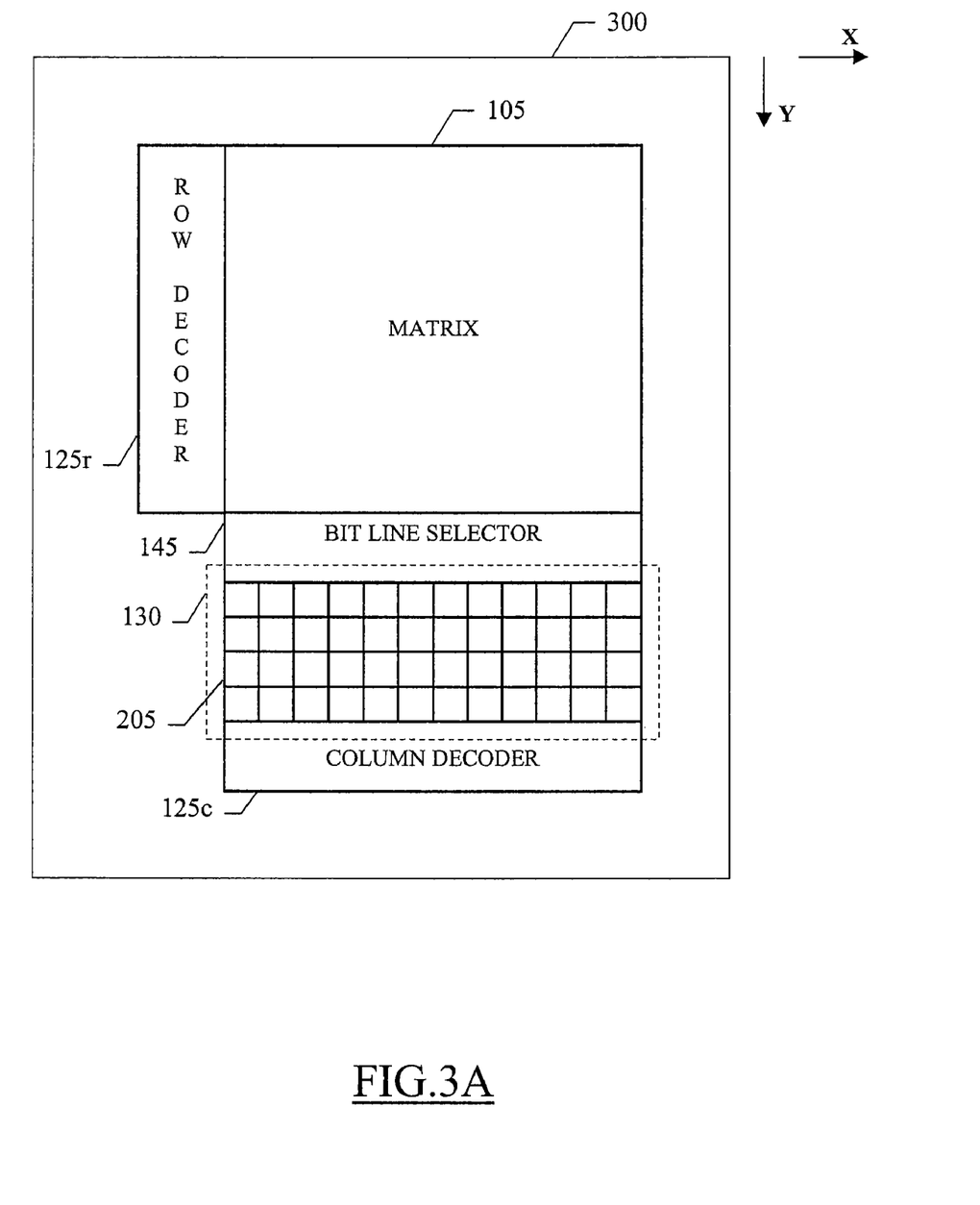
FIG. 3A is a simplified topological top plan view of the memory device according to an embodiment of the present invention.

Referring to FIG. 3A, a simplified topological top plan view of the memory device 100 is illustrated in a schematic view according to an embodiment of the present invention.

More particularly, in this Figure there is depicted an exemplary arrangement of the most important circuital blocks included in the memory device 100 (and previously described) on a semiconductor chip 300. The memory matrix 105 is illustrated as a rectangular area, with the row decoder 125r positioned adjacently to the matrix left side, and the area of the bit line selector 145 that is positioned adjacently to the bottom side of the memory matrix. The page buffer 130 occupies the area placed directly under that of the bit line selector 145, and the column decoder 125c is placed directly under the page buffer 130. It has to be noted that the present description of the arrangement of the various circuital blocks included in the memory device refers to a case that is to be considered as typical for a NAND memory.

The page buffer 130 includes a plurality of read/program units 205. Each unit 205 is connected to a pair of bit lines (BLe, BLo) of the memory matrix 105.

The FIG. 3A further includes, for the sake of clarity, two perpendicular arrows X, Y defining two reference directions. Particularly, the arrow X defines a horizontal direction (the direction along which the word lines extend), while the arrow Y defines a vertical direction (the direction of extension of the bit lines).

Because of space constraints, it is practically impossible to position a read/program unit 205 in the area located directly under (looking at the drawing) the space occupied by the corresponding pair of bit lines (BLe, BLo). In fact, the pitch of a pair of bit lines along the X direction is much lower than the pitch of the corresponding single read/program unit 205 (which includes several transistors). For this reason, groups of more than one read/program unit, for example four read/program units 205, are positioned in a stack along the Y direction, in the pitch of a corresponding number of (e.g., four) pairs of bit lines.

Figure 3B:
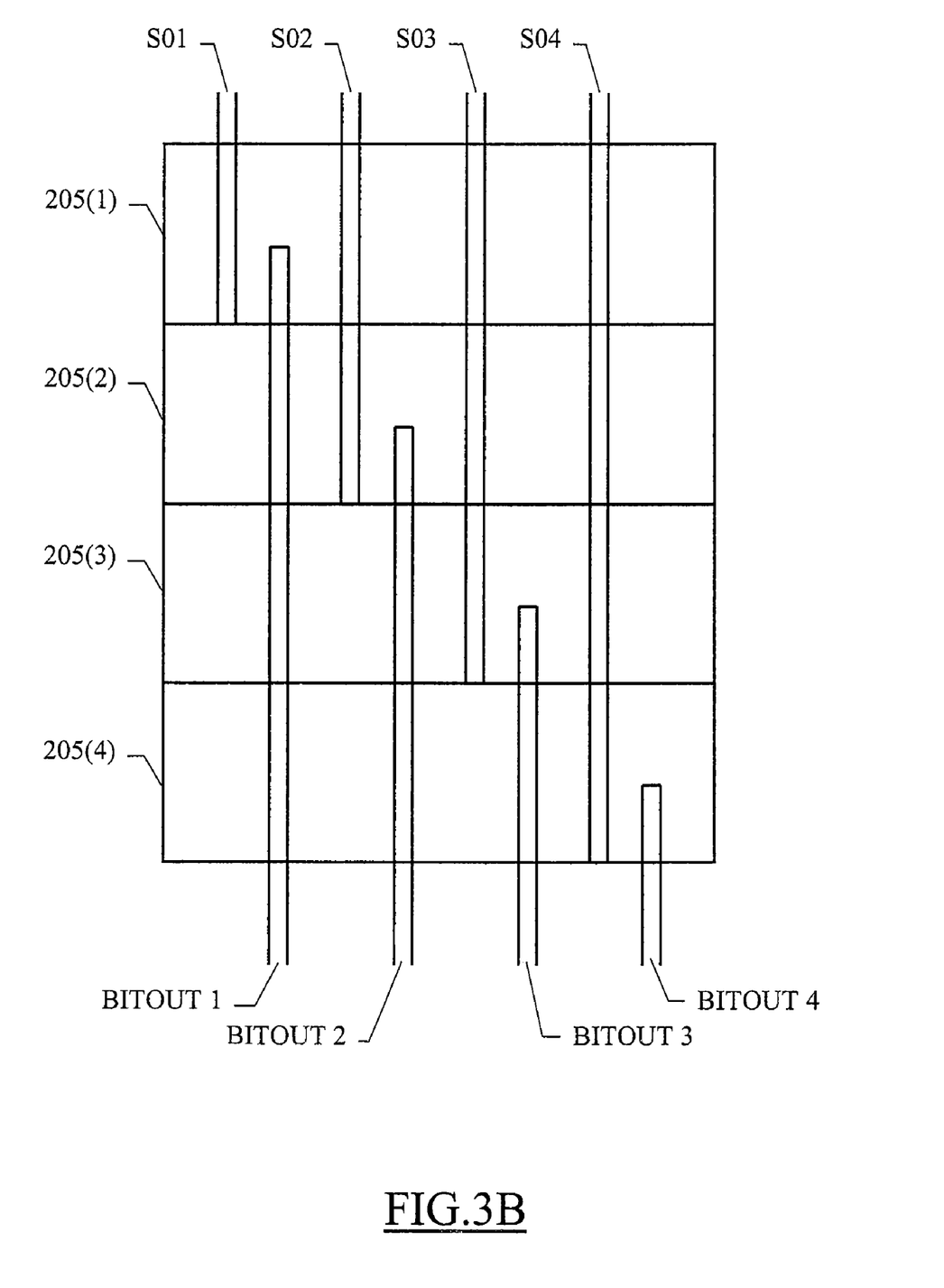
FIG. 3B illustrates a more detailed view of a stack of four read/program units.

As illustrated in greater detail in the FIG. 3B, the coupling between each pair of bit lines and a corresponding read/program unit 205($i$) ($i$=1 to 4), i.e., the circuit node SO, is accomplished by means of a respective conductive track SOi ($i$=1 to 4) that runs in the Y direction from the lower margin of the area of the bit line selectors 145 to the bottom of the area occupied by the corresponding read/program unit.

Furthermore, each read/program unit 205($i$) is connected to the column decoder block 125c by means of a further conductive track BITOUTi ($i$=1 to 4) that runs in the Y direction from within the area occupied by the corresponding read/program unit 205($i$) to the area occupied by the column decoder 125c.

Observing the FIG. 3B, it is possible to see that each read/program unit 205($i$) is crossed by five conductive tracks, running in the Y direction. Defining with the term "signal levels" (SL) the number of signal conductive tracks that are encountered moving along the X direction through the area occupied by a generic read/program unit 205($i$), SL is equal to five.

As already mentioned in the foregoing, in some operating phases of the page buffer 130, the node SO of a read/program unit 205($i$), and thus the corresponding conductive track SOi, may have to be kept at the supply voltage Vdd in a floating condition. Said floating condition is characterized by being strongly influenceable by the capacitive couplings between adjacent conductive tracks, due to the unavoidable presence of parasitic capacitances (not shown in the Figure). For example, if a memory cell 110 selected for reading has been ascertained to be programmed, the node SO (and the corresponding conductive track SOi) of the associated read/program unit 205($i$) has to remain at the supply voltage value Vdd. If the voltage values of the adjacent conductive tracks pass from the supply voltage Vdd toward the ground voltage (e.g., because the associated memory cells have been ascertained to be conductive), the voltage of the conductive track SOi in consideration will be undesirably affected, dropping by a certain (hardly predictable) amount. If said voltage decrease exceeds the trigger threshold of the latch 230-2 included in the read/program unit 205($i$), the voltage value of the node SOi will not be able to cause the latch to switch, thus providing a wrong read operation result. It has to be noted that the conductive tracks whose voltages mainly affect the voltage value of the node SO of a generic read/program unit are the conductive tracks forming the circuit nodes SO of the remaining read/program units of the group, because they run essentially in parallel along the Y direction.

The abovementioned drawback is exacerbated by the fact that the conductive tracks SOi have associated therewith parasitic capacitances of highly different values, because of their different lengths in the Y direction.

In order to equalize the effect of parasitic capacitances on the different conductive tracks SOi of the read/program units of a group, capacitors may be deliberately provided for in the circuit design, connected to the conductive tracks SOi themselves. However, it is difficult to add capacitors having a capacitance value adapted to achieve a good capacitive matching among all the conductive tracks SOi. Moreover, adding several capacitors implies an excessive waste of silicon area.

Another solution for equalizing the parasitic capacitances of the different conductive track SOi consists of extending each conductive track SOi so that all the tracks SOi have an essentially equal length along the Y direction.

However, by extending each conductive track SOi in the Y direction so that it traverses the whole area occupied by the group of stacked read/program unit 205($i$), the SL increases, and becomes equal to eight in the example at issue. This may pose problems in terms of space constraints: accommodating eight conductive tracks in the pitch of eight bit lines is in fact not easy, or it may even be impractical.

Figure 4:
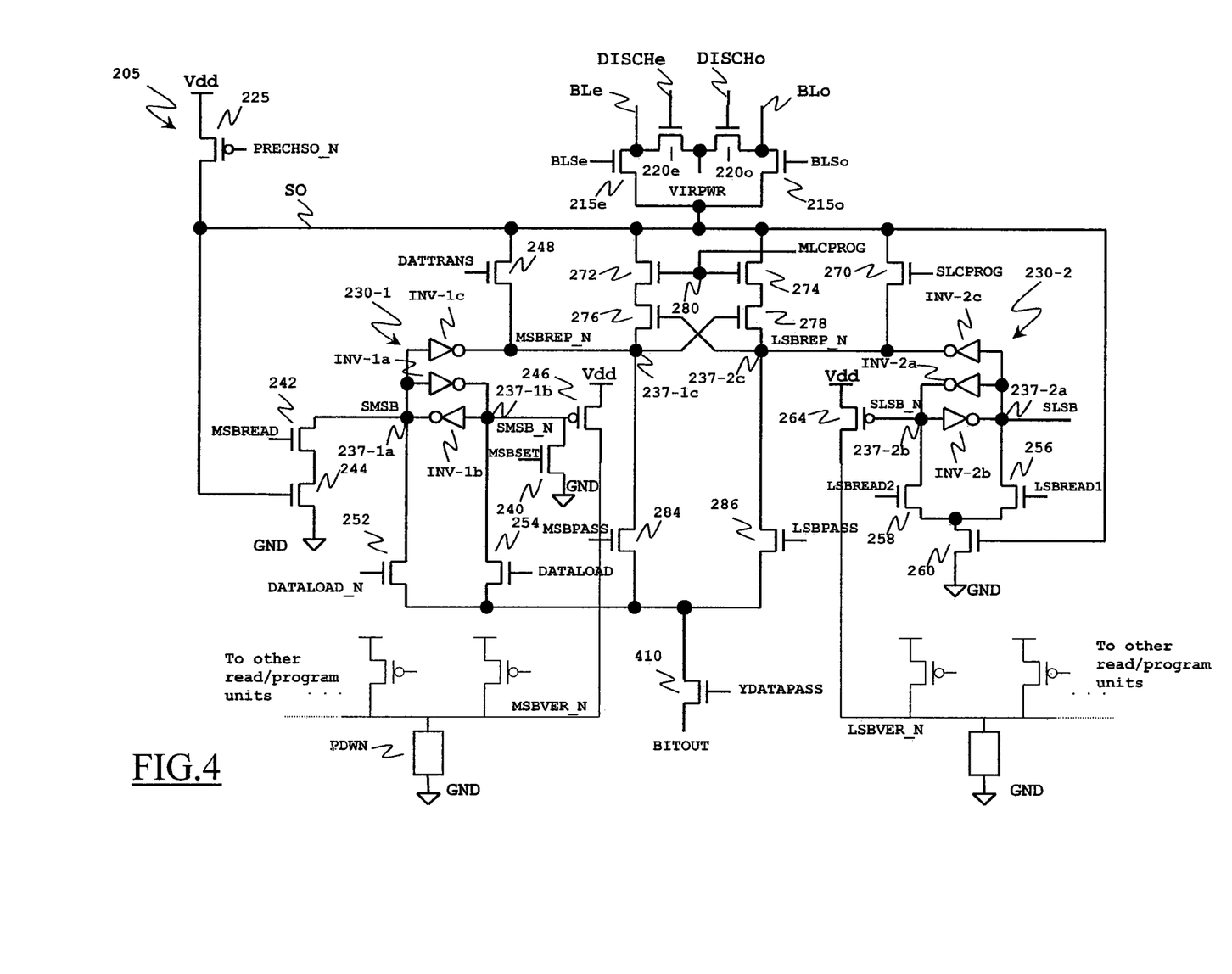
FIG. 4 illustrates the circuital view of a read/program unit included in the page buffer of the memory device, according to a further embodiment of the present invention.

For extending all the conductive tracks SOi in the Y direction so that they all traverse the whole area occupied by the group of stacked read/program unit 205($i$), without however incurring problems related to the increase of the SL value, a possible solution consists of providing a shared single conductive track BITOUT per each stack of four read/program units 205($i$). To accomplish this, as can be seen in FIG. 4, a column-selection N-channel transistor 410 may be introduced within the structure of the generic read/program unit 205 previously described. More particularly, the column-selection transistor 410 has the drain terminal connected to the source terminals of the transistors 252, 254, 284, 286, the gate terminal that receives a column selection signal YDATAPASS, and the source terminal that is connected to a conductive track BITOUT that is common to all the read/program units 205($i$) belonging to the stack. During the phase in which the read/program units 205($i$) have to output data to the column decoder, one column selection transistor 410 among the four of the four read/program units of the group is activated at a time by the column decoding signal YDATAPASS. This does not pose problems because, as previously mentioned, the bits are read in large numbers in parallel from a memory page, for example 16K, and are provided to the I/O terminals of the I/O buffers 140 in groups of 8/16 bits in succession. Thus it is possible to manage a sequential column decoding for the read/program units 205($i$) belonging to a stack, thereby each read/program unit is uniquely assigned the shared single conductive track BITOUT according to a time-division multiplexing scheme. It is observed that, in order to further equalize the effects of parasitic capacitances on the conductive tracks SOi of a stack of read/program units 205(i), it is important to consider also the physical routing of the tracks themselves.

Figure 3C:
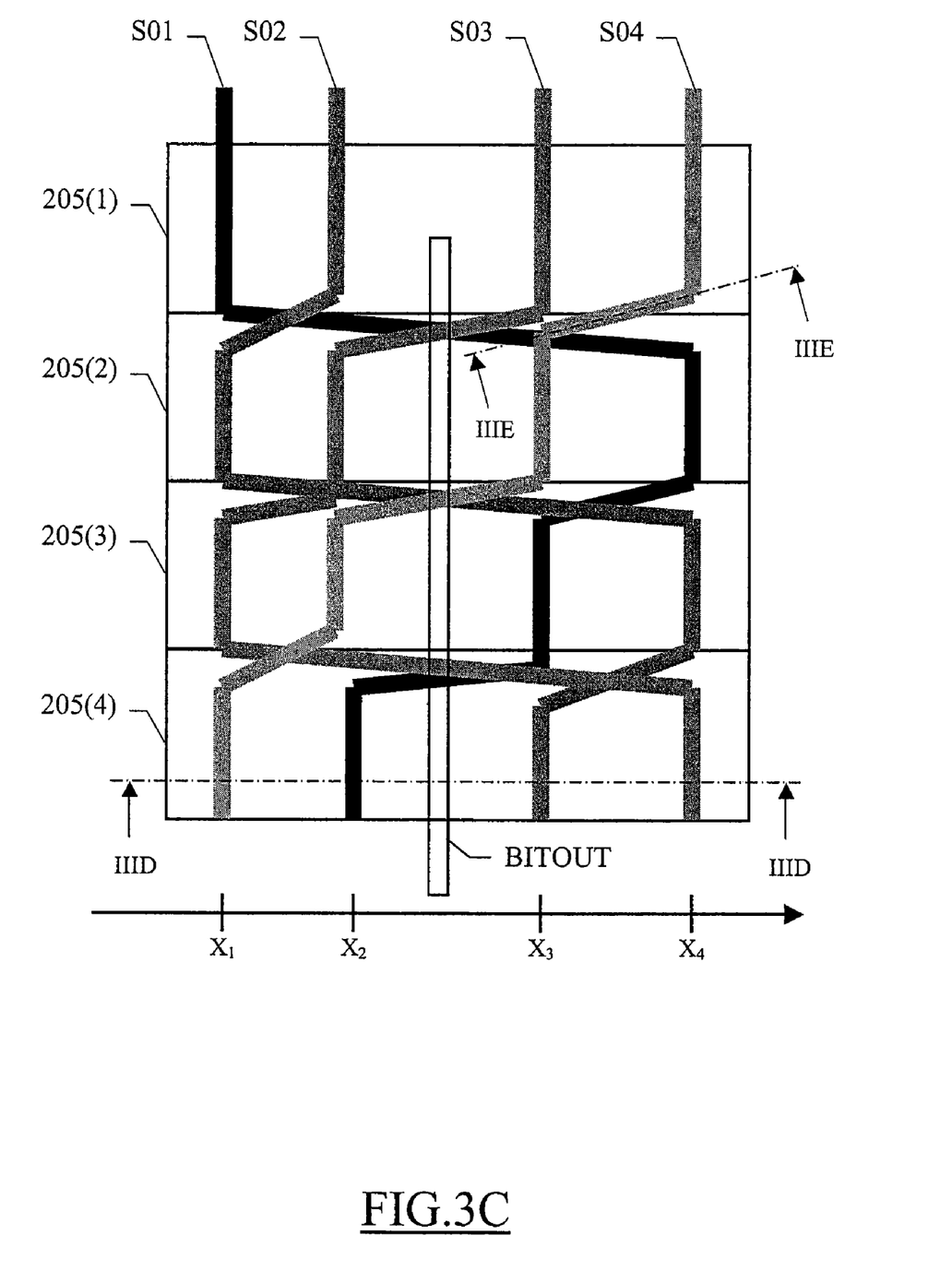
FIG. 3C illustrates a further detailed view of the stack of four read/program units, according to an embodiment of the present invention.

Referring to FIG. 3C, a more detailed view of a stack of four read/program units 205(i), each one including a corresponding column selection transistor 410, and of the corresponding conductive tracks are illustrated according to an embodiment of the present invention.

As can be seen, each one of the four conductive tracks SOi defines a winding path running from the memory matrix 105 to the column decoder 125c, swinging in the X and Y directions, and is "twisted", "intertwined" with the other conductive tracks SOi. More particularly, in an exemplary but not limitative embodiment of the present invention, indicating as X1, X2, X3, X4 four different positions from the left to the right along the X direction, all the conductive tracks SOi, in their path from the memory matrix 105 to the column decoder 125c, occupy all of said four positions X1, X2, X3, X4, in an essentially similar way. For example, referring to the conductive track SO1, it can be regarded as subdivided in four segments, a first segment, in correspondence of the area of the read/program unit 205(1), occupying the position X1, a second segment, connected to the first segment, in correspondence of the read/program unit 205(2), occupying the position X4, a third segment, connected to the second segment, in correspondence of the read/program unit 205(3), occupying the position X3, and a fourth segment, connected to the third segment, in correspondence of the read/program unit 205(4), occupying the position X2. Consequently, the conductive tracks SOi of a stack of read/program units exhibit essentially the same parasitic capacitances (having the same lengths), and, thanks to the "intertwined" arrangement, they experience essentially equal capacitive couplings.

Furthermore, the single conductive track BITOUT that is common to all the read/program units 205(i) belonging to a stack preferably runs in the center of the stack, between the positions X2 and X3; in this way, the structure is essentially symmetric.

For further reducing the effects of the capacitive couplings, it is possible to realize the conductive tracks SOi by means of different levels of metallic layers in correspondence to the different positions X1, X2, X3, X4 along the X direction. Consequently, it is possible to isolate almost completely each conductive track SOi from the other of the stack. For example, if the segments of tracks corresponding to the positions X1 and X4 may be formed in a first metallic layer (e.g. in metal 1), and those corresponding to the positions X2 and X3, plus the conductive track BITOUT, may be formed in a second metallic layer (e.g., metal 2, being a metallic layer patterned to define conductive tracks running essentially in the same direction as those formed from the metal 1): the nodes SO corresponding to the conductive tracks SOi are thus kept isolated during the read operations. In fact, the segments of the conductive tracks SOi that are realized in metal 2 are shielded from the conductive track BITOUT, while the capacitive couplings among metal 1 and metal 2 are negligible.

Figure 3D:
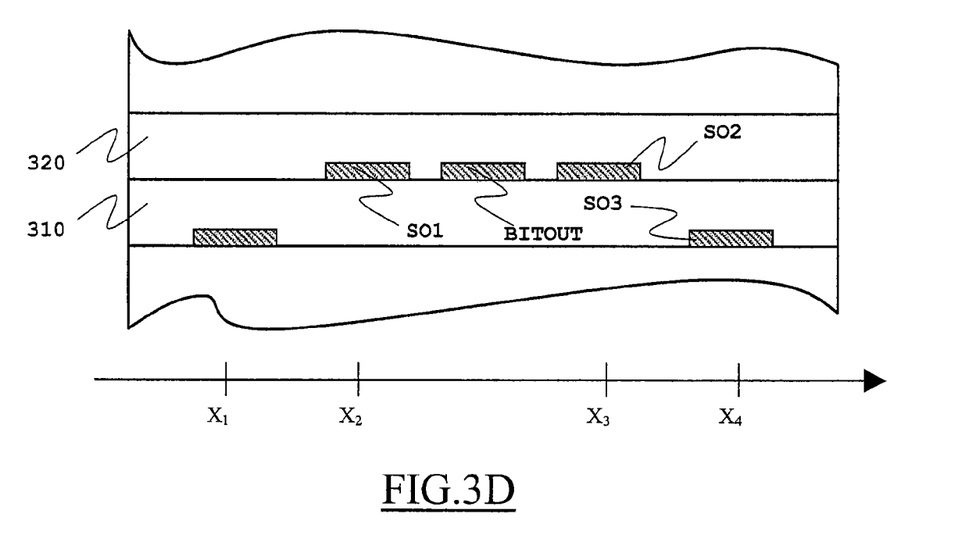
FIG. 3D illustrates a first cross-sectional view of a read/program unit.

By way of example, FIG. 3D shows a very simplified cross-sectional view of the exemplary read program unit 205 (4) shown in the FIG. 3C, along the line IIID-IIID. In this section, only some elements are represented. Here, the conductive tracks SO4 (corresponding to the position X1) and SO3 (corresponding to the position X4) are in a first layer 310 and are photolithographically realized from a first layer of metal, while the conductive tracks SO1 (corresponding to the position X2), SO2 (corresponding to the position X3) and the conductive track BITOUT are in a second layer 320 and are photolithographically realized from a second layer of metal.

Figure 3E:
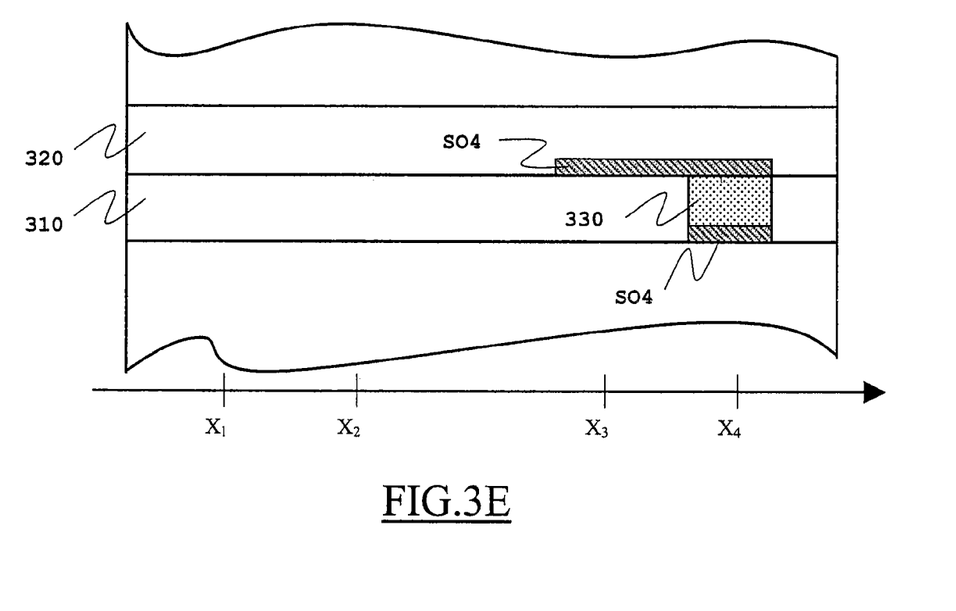
FIG. 3E illustrates a second cross-sectional view of a read/program unit.

Moreover, FIG. 3E is a very simplified cross-sectional view of a portion of read program units 205(1) and 205(2) shown in the FIG. 3C, along the line IIIE-IIIE. In this section, for the sake of simplicity, only the conductive track SO4 is illustrated. The segment of the conductive track SO4 belonging to the read/program unit 205(1) corresponds to the position X4, and thus is realized from the first layer of metal. The segment of the conductive track SO4 belonging to the read/program unit 205(2) corresponds to the position X3, and thus is realized from the second layer of metal. As can be shown from the FIG. 3E, the connection of this two segments belonging to different layers of metal is realized by a via 330.

Naturally, in order to satisfy local and specific requirements, a person skilled in the art may apply to the solution described above many modifications and alterations. Particularly, although the present invention has been described with a certain degree of particularity with reference to preferred embodiment(s) thereof (e.g., referring to the specific page buffer 130), it should be understood that various omissions, substitutions and changes in the form and details as well as other embodiments are possible. For example, the concepts of the present invention are also applicable exchanging the page buffer 130 with a page buffer of whichever type. Moreover, it is expressly intended that specific elements and/or method steps described in connection with any disclosed embodiment of the invention may be incorporated in any other embodiment as a general matter of design choice.

The invention claimed is:

1. A memory device, including:
   a matrix of memory cells structured to store data and arranged in a plurality of bit lines, the bit lines extending along a first direction;
   a page buffer structured to interface the matrix with a downstream circuitry, the page buffer comprising a plurality of read/program units, each read/program unit being associated with and operatively couplable to at least one bit line;
   at least two groups each including at least two respective read/program units, wherein the read/program units of a generic one of said groups are generically aligned along the first direction, said at least two groups being generically aligned along a second direction transversal to the first direction;
   a plurality of signal tracks respectively associated with said groups, for conveying signals corresponding to data read from the memory cells to the downstream circuitry, each signal track being shared by the at least two read/program units of the associated group; and
   means for selectively assigning each signal track to one of the associated read/program units at a time among the at least two read/program units of the group associated with said signal track.

2. The memory device of claim 1, wherein said signal track crosses the read/program units of the respective group, extending along the first direction.

3. The memory device of claim 1, wherein each one of said read/program units is associated with a respective one of the bit lines and comprises a coupling signal line electrically couplable to the bit line associated with the read/program unit, for applying to the coupled bit line one among two electric potential values, the coupling signal line extending across all the read/program units of the corresponding group.

4. The memory device of claim 3, wherein each of said at least two groups of at least two read/program units includes N read/program units with N coupling signal lines, and the N coupling signal lines extend generally along the first direction while being intertwined with each other.

5. The memory device of claim 4, wherein:
each group of N read/program units has associated therewith N positions defined along the second direction;
each coupling signal line of the N coupling signal lines of the group includes N line segments, the N line segments occupying each a different one of the N positions.

6. The memory device of claim 5, wherein said segments have substantially equal lengths.

7. The memory device of claim 6, wherein each segment has a length substantially equal to a length of the generic read/program unit along the first direction.

8. The memory device according to claim 3, wherein said signal track of one of the groups is arranged between the coupling signal lines associated with the at least two read/program units of the group.

9. A memory device comprising:
an array of memory cells having a plurality of bit lines;
a plurality of read/program units arranged in a plurality of columns, each column forming a group of the units and extending in a first direction, each unit being coupled to one or more bit lines and having a signal line configured to supply a voltage to the one or more bit lines of the unit; and
a plurality of output tracks associated respectively with the groups, the output tracks being configured to output data to circuitry downstream, wherein, for each group, the units in the group share and are coupled to the output track associated with the group; and the output track associated with the group crosses the read/program units of the group, extending along the first direction.

10. The memory device according to claim 9 wherein, for each group, the signal lines of the units of the group extend across a length of the group of units in intertwining paths.

11. The memory device according to claim 10 wherein, for each group, the signal lines of the group are formed in a plurality of layers on a substrate.

12. The memory device according to claim 9 wherein, for each group, the output track of the group extends centrally of the group of units in the first direction.

13. A memory device comprising:
an array of memory cells having a plurality of bit lines;
a plurality of read/program units arranged in a plurality of columns, each column forming a group of the units and extending in a first direction, each unit being coupled to one or more bit lines and having a signal line configured to supply a voltage to the one or more bit lines of the unit, wherein:
the units in a group share and are coupled to an output track configured to output data to circuitry downstream; and
the signal lines of the units in a group have an approximately same length.

14. The memory device according to claim 13 wherein, for each group, the signal lines of the units of the group extend across a length of the group of units in intertwining paths.

15. The memory device according to claim 14 wherein, for each group, the signal lines of the group are formed in a plurality of layers on a substrate.

16. The memory device according to claim 13 wherein, for each group, the output track of the group extends centrally of the group of units in the first direction.

17. A method for implementing a page buffer in a memory device, the page buffer having a plurality of read/program units, the memory device having memory cells connected to array bit lines, the method comprising:
organizing the units into a plurality of columns, each column forming a group of units, each unit being coupled to one or more bit lines and having a signal line configured to apply a voltage to a bit line coupled to the unit;
coupling each unit in a group to a same signal track configured to output data to circuitry downstream; and
forming the signal line of each unit in a group to be approximately the same length.

18. The method according to claim 17 comprising:
intertwining the signal lines of a group across the length of the column of units.

* * * * *